United States Patent [19]
Shiralagi et al.

[11] Patent Number: 5,897,366
[45] Date of Patent: *Apr. 27, 1999

[54] METHOD OF RESISTLESS GATE METAL ETCH FOR FETS

[75] Inventors: Kumar Shiralagi, Chandler; Saied N. Tehrani, Tempe, both of Ariz.

[73] Assignee: Motorola, Inc., Schaumburg, Ill.

[ * ] Notice: This patent is subject to a terminal disclaimer.

[21] Appl. No.: 08/813,400

[22] Filed: Mar. 10, 1997

[51] Int. Cl.⁶ .................................................. H01L 21/20
[52] U.S. Cl. .......................... 438/604; 438/606; 438/607; 438/695; 438/718
[58] Field of Search .................... 437/228; 438/705, 438/718, 739, 804, 507, 171, 172, 184, 522, 571, 572, 604, 605, 606, 607, 695, 717

[56] References Cited

U.S. PATENT DOCUMENTS

| | | | |
|---|---|---|---|
| 4,965,218 | 10/1990 | Geissberger et al. | 437/41 |
| 5,356,509 | 10/1994 | Terranova et al. | 117/58 |
| 5,466,639 | 11/1995 | Ireland | 437/195 |
| 5,580,419 | 12/1996 | Berenz | 156/628.1 |
| 5,604,154 | 2/1997 | Takahashi et al. | 437/186 |
| 5,759,880 | 6/1998 | Shiralagi et al. | 438/184 |

*Primary Examiner*—Charles Bowers
*Assistant Examiner*—Reneé R. Berry
*Attorney, Agent, or Firm*—Eugene A. Parsons; William E. Koch

[57] ABSTRACT

A method of resistless gate metal etch in the formation of a field effect transistor is disclosed, which includes providing a first layer of a first semiconductor material having a surface. A second layer of a second semiconductor material is formed on the surface and resistlessly patterned to define a masked and an unmasked portions. The unmasked portion of the second layer is etched away to the first layer to enable gate formation.

6 Claims, 1 Drawing Sheet

5,897,366

METHOD OF RESISTLESS GATE METAL ETCH FOR FETS

FIELD OF THE INVENTION

The present invention pertains to the fabrication of semiconductor devices and more specifically to improved masking techniques during semiconductor device fabrication.

BACKGROUND OF THE INVENTION

Currently, gate metal etch processes employ a nitride or oxide mask for the formation of gate metal in semiconductor devices. The nitride mask is patterned by using a photoresist mask. The process begins by forming a nitride layer on the surface being masked. A photoresist mask layer is then formed on the nitride. Formation of a photoresist mask takes many steps. Typically, five steps are required. The nitride layer is then etched and used as a mask to etch the underlying material. This typically takes four steps. Once the desired topography is formed, the nitride mask must be removed. An additional three steps are used here.

In addition to taking numerous steps which add to costs and reduce yields, the conventional process using photoresist can cause contamination problems. Furthermore, etching is required to remove unwanted material, and masks are removed by etching, solvent, or the like. During the etching and/or mask removal processes, the material of the semiconductor device has a high likelihood of being contaminated by the etchant, which contamination greatly reduces the life of the device, the operating characteristics of the device, and the reliability of the device. The etch needed to remove the nitride mask can damage the semiconductor material adjacent the etched areas which further reduces life, operating characteristics, and reliability.

Thus, the prior art technique involves many process steps such as resist spinning, exposure, developing, cleaning and so on. All of these processes can introduce contamination, decrease yield, etc. A further problem that arises is that the structure or substrate (generally a wafer) must be removed from the growth chamber to remove the masking material. The structure is then masked again and reintroduced into the growth chamber for re-growth or for further processing. Thus, the prior art techniques keep the wafer vacuum incompatible.

Accordingly, it would be highly desirable to provide a new and improved method of resistless gate metal etch in the formation of a heterojunction field effect transistor.

It is a purpose of the present invention to provide a new and improved method of resistless gate metal etch in the formation of a heterojunction field effect transistor having reduced steps.

It is another purpose of the present invention to provide a new and improved method of resistless gate metal etch in the formation of a field effect transistor which is vacuum compatible.

It is still another purpose of the present invention to provide a new and improved method of resistless gate metal etch in the formation of a field effect transistor which does not require the introduction of contaminants, such as photoresist, solvents and etchants.

It is a further purpose of the present invention to provide a new and improved method of resistless gate metal etch in the formation of a field effect transistor which is much simpler and includes less chance of contamination of the devices.

And a further purpose of the present invention is to provide a new and improved method of resistless gate metal etch in the formation of a field effect transistor which can be a completely dry process.

SUMMARY OF THE INVENTION

Briefly, to achieve the desired objects of the instant invention in accordance with a preferred embodiment thereof, provided is a method of resistless gate metal etch in the formation of a field effect transistor. The method includes providing a first layer of a first semiconductor material having a surface. A second layer of a second semiconductor material is formed on the surface and resistlessly patterned to define a masked and an unmasked portions. The unmasked portion of the second layer is etched away to the first layer.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DESCRIPTION OF THE PREFERRED EMBODIMENT

Figure 1:
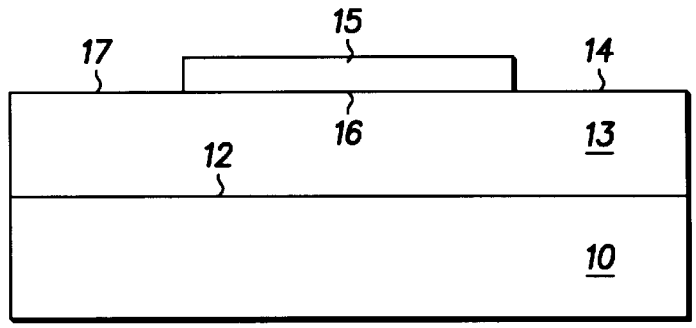
FIGS. 1–4 are simplified sectional views illustrating several sequential steps in a gate metal etch process, in accordance with the present invention.

Turning now to the drawings in which like reference characters indicate corresponding elements throughout the several views, attention is first directed to FIGS. 1–4, which illustrate the sequential steps in a gate metal etch process employed in the fabrication of a field effect transistor (FET) in accordance with the method of the present invention. With specific reference to FIG. 1, first provided is a layer 10 of AlGaAs, having a surface 12. It should be understood that layer 10 can be simply GaAs or any convenient semiconductor material, and that while AlGaAs is utilized herein for purposes of describing the fabrication of a heterojunction FET, other III–V compounds and other semiconductor materials may be utilized for other types of FETs. It should also be understood that layer 10 might be a supporting structure, such as a wafer or the like, or it might be a layer or layers formed on a supporting structure. A layer 13 of GaAs and having a surface 14, is formed on surface 12. While GaAs is utilized herein for purposes of this description any semiconductor material can be used which will form a heterojunction with the material of layer 10.

Still referring to FIG. 1, a mask 15 is positioned adjacent to surface 14 of layer 13 for patterning surface 14, as will be explained presently. Mask 15 generally is a shadow or metal mask but, in some special applications, it can be formed in the well known manner with photolithography as in an aligner or stepper (generally includes a projected image from a mask). As will become apparent presently, one of the major advantages of the present technique is that photolithography and the like are not necessary for the described masking operations. In a preferred embodiment, mask 15 is a mask plate. In any case, mask 15 is positioned adjacent surface 14 so as to define one or more covered portions 16 on surface 14 beneath mask 15 and one or more uncovered portions 17 on surface 14.

Uncovered portions 17 of surface 14 are exposed to a bright light preferably including deep ultraviolet, represented by arrows 21 in FIG. 1. The bright light may be, for example, the type typically used in aligners, steppers, or E-beam devices in the semiconductor industry. The term "deep ultraviolet" refers to light in the ultraviolet range, generally with a wavelength in the range of 180 to 250 nanometers. In the present specific example, it is believed that the 185 nm light generates ozone due to optical excitation. Therefore, excitation wavelength that is most suitable for efficient ozone generation is also the most efficient to use, although virtually any ultraviolet light will produce the desired result. It is believed that exposure to other wavelengths, such as 248 nm in a specific example, modifies the composition of the surface oxide by forming a different kind of oxide or complex oxide molecules that are more stable than the native oxide. The exposure to light can be performed under a lamp. However, when the light is collimated, as in an aligner or stepper, sharp features can be defined in uncovered portion 17. A thin oxide mask 20 (FIG. 2) with a thickness of approximately 2 nm is produced on uncovered portions 17 of surface 14. Here it should be understood that the oxide forms very slowly and thicker layers may be used if they warrant the required addition time.

Figure 2:
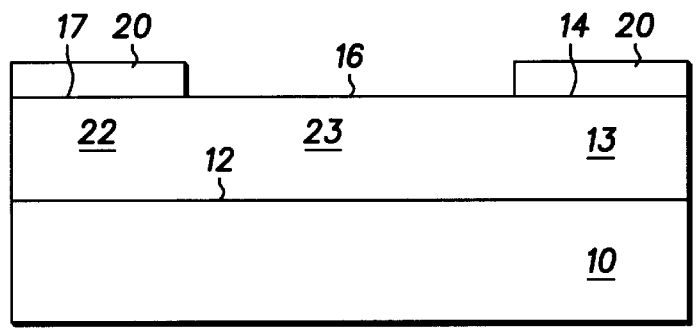

Once oxide mask 20 is grown, mask 15 is removed to expose covered portion 16, as illustrated in FIG. 2. Oxide mask 20 then serves as a mask for etching layer 13. Thin oxide mask 20 defines masked portions 22 and unmasked portions 23, corresponding to uncovered portions 17 and covered portion 16 respectively.

Figure 3:
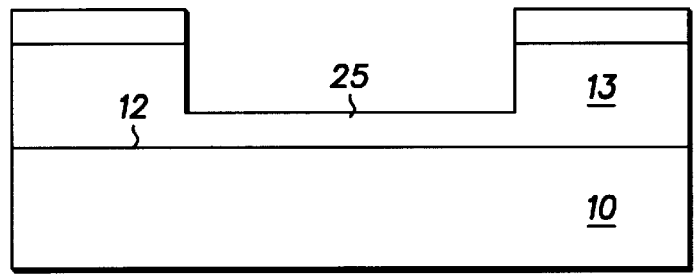
Figure 4:
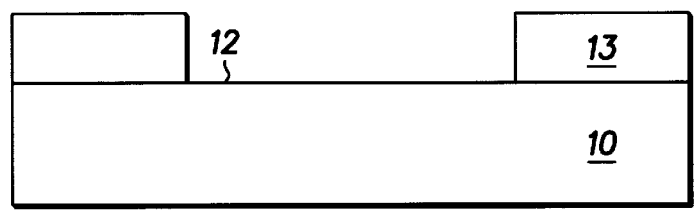

Referring now to FIGS. 3–4, unmasked portion 23 of layer 13 is removed by etching to form a gate area on layer 10. Any conventional etching techniques may be utilized, including wet etch, dry etch, ECR, etc. Etching away unmasked portion 23 includes etching away layer 13 close to layer 10 to leave a remaining portion 25 as shown in FIG. 3. Remaining portion 25 is removed by selectively etching to etch stop at layer 10 as shown in FIG. 4. In the etching process, if the mask does not hold for the entire etch process, then layer 20 and a small portion of layer 13 underneath layer 20 may get etched away, but this will not effect the overall process. This provides a gate area in which gate metal can be deposited on undamaged and uncontaminated surface 12 of layer 10.

Figure 5:
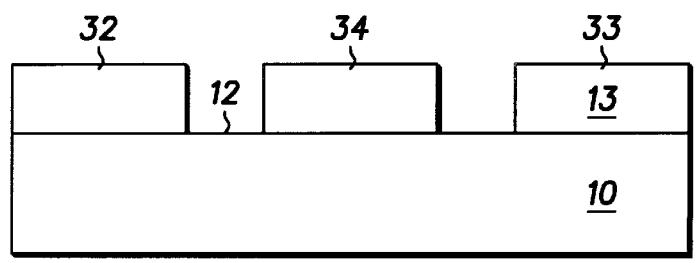
FIG. 5 is a simplified sectional view of a field effect transistor fabricated in accordance with the method of the present invention.

Turning now to FIG. 5, a simplified sectional view of an example of a field effect transistor, which in this specific example is a heterojunction field effect transistor (HFET) 30, fabricated in accordance with the method of the present invention, is illustrated. HFET 30 includes layer 10 and layer 13 forming the heterojunction. Layer 13 has been divided into a source 32 and drain 33 by the gate metal etch. A gate metal contact 34 is formed on surface 12, intermediate source 32 and drain 33 in this embodiment. Further processing is then performed which is similar to conventional FET processing.

Thus, a new and improved method of resistless gate metal etch in the formation of a heterojunction field effect transistor is disclosed which has a greatly reduced number of steps, which is vacuum compatible and which does not require the introduction of contaminants, such as photoresist, solvents and etchants. The disclosed method of resistless gate metal etch in the formation of a heterojunction field effect transistor is much simpler and includes less chance of contamination of the devices and can be a completely dry process.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention is:

What is claimed is:

1. A method of resistless gate metal etch in the formation of a field effect transistor comprising the steps of:

providing a semiconductor layer having a surface, wherein a natural oxide layer is formed on the surface;

resistlessly patterning the natural oxide layer by directing patterned light thereupon to define a masked and an unmasked portion; and using the patterning of the natural oxide layer, etching away the masked portion of the natural oxide layer and the semiconductor layer contiguous thereto to enable gate formation.

2. A method of resistless gate metal etch in the formation of a field effect transistor as claimed in claim 1 wherein the step of resistlessly patterning includes positioning a hard mask adjacent the natural oxide layer layer so as to define the masked portion and the unmasked portion and selectively directing a bright light onto the unmasked portion to modify the thin oxide mask on the masked portion.

3. A method of resistless gate metal etch in the formation of a field effect transistor as claimed in claim 1 wherein the semiconductor layer includes GaAs.

4. A method of resistless gate metal etch in the formation of a field effect transistor comprising the steps of:

providing a semiconductor layer having a surface, wherein a natural oxide layer is formed on the surface;

positioning a hard mask adjacent the natural oxide layer so as to define a covered portion and an uncovered portion;

selectively directing a bright light onto the uncovered portion to grow a thin oxide mask on the uncovered portion, the thin oxide mask defining masked and unmasked portions corresponding to the uncovered and the covered portions respectively; and using the thin oxide mask, etching away the unmasked portion of the natural oxide layer and second layer to enable gate formation.

5. A method of resistless gate metal etch in the formation of a field effect transistor as claimed in claim 4 wherein the semiconductor layer includes GaAs.

6. A method of resistless gate metal etch in the formation of a heterojunction field effect transistor comprising the steps of:

providing a first layer of AlGaAs having a surface;

forming a second layer of GaAs on the surface to form a heterojunction, wherein a natural oxide layer is formed on the surface of the second layer;

positioning a hard mask adjacent the natural oxide layer so as to define a covered portion and an uncovered portion;

selectively directing a bright light onto the uncovered portion to grow a thin oxide mask on the uncovered portion, the thin oxide mask defining masked and unmasked portions corresponding to the uncovered and the covered portions respectively; and using the thin oxide mask, etching the covered portion and the second layer close to the first layer to leave a remaining portion; and selectively etching the remaining portion to etch stop at the first layer.

\* \* \* \* \*